(12) United States Patent
Bartley et al.

(10) Patent No.: US 8,788,748 B2
(45) Date of Patent: Jul. 22, 2014

(54) IMPLEMENTING MEMORY INTERFACE WITH CONFIGURABLE BANDWIDTH

(75) Inventors: Gerald K. Bartley, Rochester, MN (US); John M. Borkenhagen, Rochester, MN (US); Philip R. Germann, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 13/427,078

(22) Filed: Mar. 22, 2012

(65) Prior Publication Data

US 2013/0254473 A1 Sep. 26, 2013

(51) Int. Cl.
*G06F 13/00* (2006.01)

(52) U.S. Cl.
USPC ............. 711/105; 711/106; 711/167; 365/52; 365/63

(58) Field of Classification Search
CPC ................ G03F 13/00; H01L 25/0657; H01L 2224/16145
See application file for complete search history.

(56) References Cited

U.S. PATENT DOCUMENTS

| | | | |
|---|---|---|---|
| 7,809,913 B2 | 10/2010 | Bartley et al. | |
| 7,822,936 B2 | 10/2010 | Bartley et al. | |
| 7,913,000 B2 | 3/2011 | Chung | |
| 7,921,264 B2 | 4/2011 | Bartley et al. | |
| 7,921,271 B2 | 4/2011 | Bartley et al. | |
| 7,999,367 B2 | 8/2011 | Kang et al. | |
| 2010/0174858 A1 | 7/2010 | Chen et al. | |
| 2011/0161583 A1 | 6/2011 | Youn | |
| 2011/0309495 A1 | 12/2011 | Wang et al. | |
| 2012/0017065 A1 | 1/2012 | Muralimanohar | |
| 2013/0229848 A1* | 9/2013 | Vogelsang | 365/63 |
| 2013/0277841 A1* | 10/2013 | Lii et al. | 257/741 |
| 2013/0285244 A1* | 10/2013 | Lin et al. | 257/751 |

OTHER PUBLICATIONS

"Electrical Characterization of Through Silicon Via (TSV) for High-Speed Memory Application," by Terry Hsu et al., 33rd International Electronics Manufacturing Technology Conference 2008 IEEE/CPMT International, 1=5 doi:10.1109/IEMT.2008.5507818.

"3D Stacked Microprocessor: Are We There Yet?" by Gabriel H. Loh et al., IEEE Computer Society, pp. 60-64, May/ Jun. 2010 Micro, IEEE, 30 (3), 60-64, doi:10.1109/MM.2010.45.

"An Optimized 3D•Stacked Memory Architecture by Exploiting Excessive, High•Density TSV Bandwidth, by Dong Hyuk Woo," 987-1-4244-5659-8/09/©2009, IEEE, 2009 doi:10.1109/HPCA.2010.5416628.

\* cited by examiner

*Primary Examiner* — Mardochee Chery
(74) *Attorney, Agent, or Firm* — Joan Pennington

(57) ABSTRACT

A method and system are provided for implementing enhanced memory performance management with configurable bandwidth versus power usage in a chip stack of memory chips. A chip stack of memory chips is connected in a predefined density to allow a predefined high bandwidth connection between each chip in the stack, such as with through silicon via (TSV) interconnections. Large-bandwidth data transfers are enabled from the memory chip stack by trading off increased power usage for memory performance on a temporary basis.

17 Claims, 10 Drawing Sheets

IMPLEMENTING MEMORY INTERFACE WITH CONFIGURABLE BANDWIDTH

FIELD OF THE INVENTION

The present invention relates generally to the data processing field, and more particularly, relates to a method and system for implementing enhanced memory performance management with configurable bandwidth versus power usage in a chip stack of memory chips.

DESCRIPTION OF THE RELATED ART

Modern computer systems typically are configured with a large amount of memory in order to provide data and instructions to one or more processors in the computer systems.

Historically, processor speeds have increased more rapidly than memory access times to large portions of memory, in particular, dynamic random access memory (DRAM). Memory hierarchies have been constructed to reduce the performance mismatches between processors and memory. For example, most modern processors are constructed having an L1 (level 1) cache, constructed of SRAM (Static Random Access Memory) on a processor semiconductor chip. L1 cache is very fast, providing reads and writes in only one, or several cycles of the processor. However, L1 caches, while very fast, are also quite small, perhaps 64 KB (Kilobytes) to 256 KB. An L2 (Level 2) cache is often also implemented on the processor chip. L2 cache is typically also constructed using SRAM storage, although some processors utilize DRAM storage. The L2 cache is typically several times larger in number of bytes than the L1 cache, but is slower to read or write. Some modern processor chips also contain an L3 (Level 3) cache. L3 cache is capable of holding several times more data than the L2 cache. L3 cache is sometimes constructed with DRAM storage. L3 cache in some computer systems is implemented on a separate chip or chips from the processor, and is coupled to the processor with wiring on a printed wiring board (PWB) or a multi-chip module (MCM). Main memory of the computer system is typically large, often many GB (gigabytes) and is typically implemented in DRAM.

Main memory is typically coupled to a processor with a memory controller, which may be integrated on the same device as the processor or located separate from the processor, often on the same MCM (multi-chip module) or PWB. The memory controller receives load or read commands and store or write commands from the processor and services those commands, reading data from main memory or writing data to main memory. Typically, the memory controller has one or more queues, for example, read queues and write queues. The read queues and write queues buffer information including one or more of commands, controls, addresses and data; thereby enabling the processor to have multiple requests including read and/or write requests, in process at a given time.

Through-Silicon-Via (TSV) or TSV interconnections are used for various semiconductor chips and semiconductor chip stacking devices. Integrated circuit die stacking with packaging through silicon via (TSV) interconnections and other packaging techniques enable interconnecting die in ultra close proximity using the vertical dimension. These arrangements enable higher performance and packaging density.

U.S. Pat. No. 7,921,264, issued Apr. 5, 2011 and entitled Dual-mode memory chip for high capacity memory subsystem by the present inventors and assigned to the present assignee discloses a configurable dynamic random access memory (DRAM) including a hierarchical interleaved memory subsystem, in which each addressable set of chips is configured as a tree, command and write data being propagated down the tree, the number of chips increasing at each succeeding level of the tree. Optimization of data transfers within the hierarchy is achieved by multiplexing blocks of data from multiple memory locations, and successively speeding up the transfer frequency of the concatenated data.

The disclosed configurable DRAM and memory hierarchy enable optimizing of data transfers within the hierarchy by minimizing the power usage. Full-speed connections are enabled from a memory controller to the first rank of data with the memory controller receiving the full complement of data it requested in the same time window. Operating the lower ranks of memory in the tree at fractional speeds of the primary rank provides power saving. In order to achieve the power savings, data blocks were broken up and stored among each DRAM in the system, creating a cascaded multiplexing effect wherein the data is reassembled along the path back to the memory controller and hence the need for faster interface speeds near the controller.

One of the primary roadblocks to improved system performance today is the scalability of memory bandwidth as a function of the number of processor cores on a chip. A need exists for an effective mechanism for implementing enhanced memory performance management.

SUMMARY OF THE INVENTION

Principal aspects of the present invention are to provide a method and system for implementing enhanced memory management with configurable bandwidth versus power usage in a chip stack of memory chips. Other important aspects of the present invention are to provide such method and system substantially without negative effects and that overcome many of the disadvantages of prior art arrangements.

In brief, a method and system are provided for implementing enhanced memory performance management with configurable bandwidth versus power usage in a chip stack of memory chips. A memory chip stack of memory chips is connected in a predefined density to allow a predefined high bandwidth connection between each chip in the stack, such as with through silicon via (TSV) interconnections. Large-bandwidth data transfers are enabled from the memory chip stack by trading off increased power usage for memory performance on a temporary basis.

In accordance with features of the invention, a memory controller selectively requests data at a higher speed than a normal data read speed for the large-bandwidth data transfers.

In accordance with features of the invention, the data can be spread over all memory chips of the memory chip stack, but also limited can be to a subset of the entire hierarchy of memory chips of the memory chip stack. This allows larger data blocks to be addressed and accessed quickly.

In accordance with features of the invention, if a large block of data is required, for instance direct memory access (DMA), then the reserve bandwidth can be used at the expense of power savings to quickly transfer the data to the controller. In this scenario, all three ranks in the memory chip stack use a full-speed protocol.

In accordance with features of the invention, the use of through-silicon vias and chip-stacking techniques allow for large numbers of generally inexpensive chip-to-chip interconnections.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and system are provided for implementing enhanced memory management with configurable bandwidth versus power usage.

Figure 1:
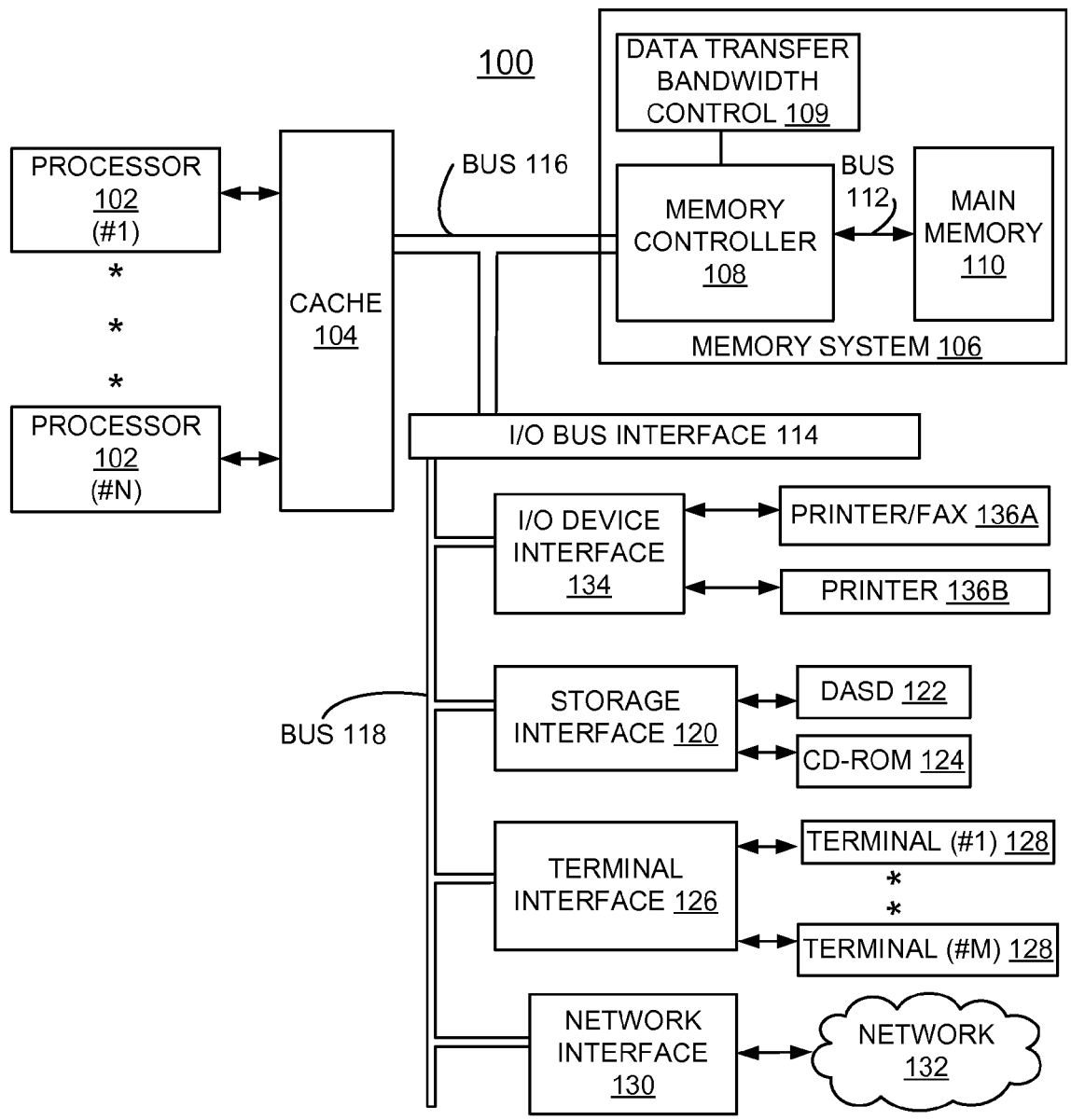
FIG. 1 is a block diagram representation illustrating an example system for implementing enhanced memory performance management with configurable bandwidth versus power usage in accordance with the preferred embodiment.

Having reference now to the drawings, in FIG. 1, there is shown an example computer system generally designated by the reference character 100 for implementing enhanced memory management with configurable bandwidth versus power usage in accordance with the preferred embodiment.

Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a memory system 106 including a memory controller 108 including a data transfer bandwidth control 109 in accordance with an embodiment of the invention and a main memory 110 connected by a bus 112. Bus 112 is one or more busses that send address/command information to main memory 110 and send and receive data from the memory 110. Main memory 110 is a random-access semiconductor memory for storing data, including programs. Main memory 110 is comprised of, for example, a plurality of dynamic random access memories (DRAMs), and optionally other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, memory controller 108 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

Figure 4:
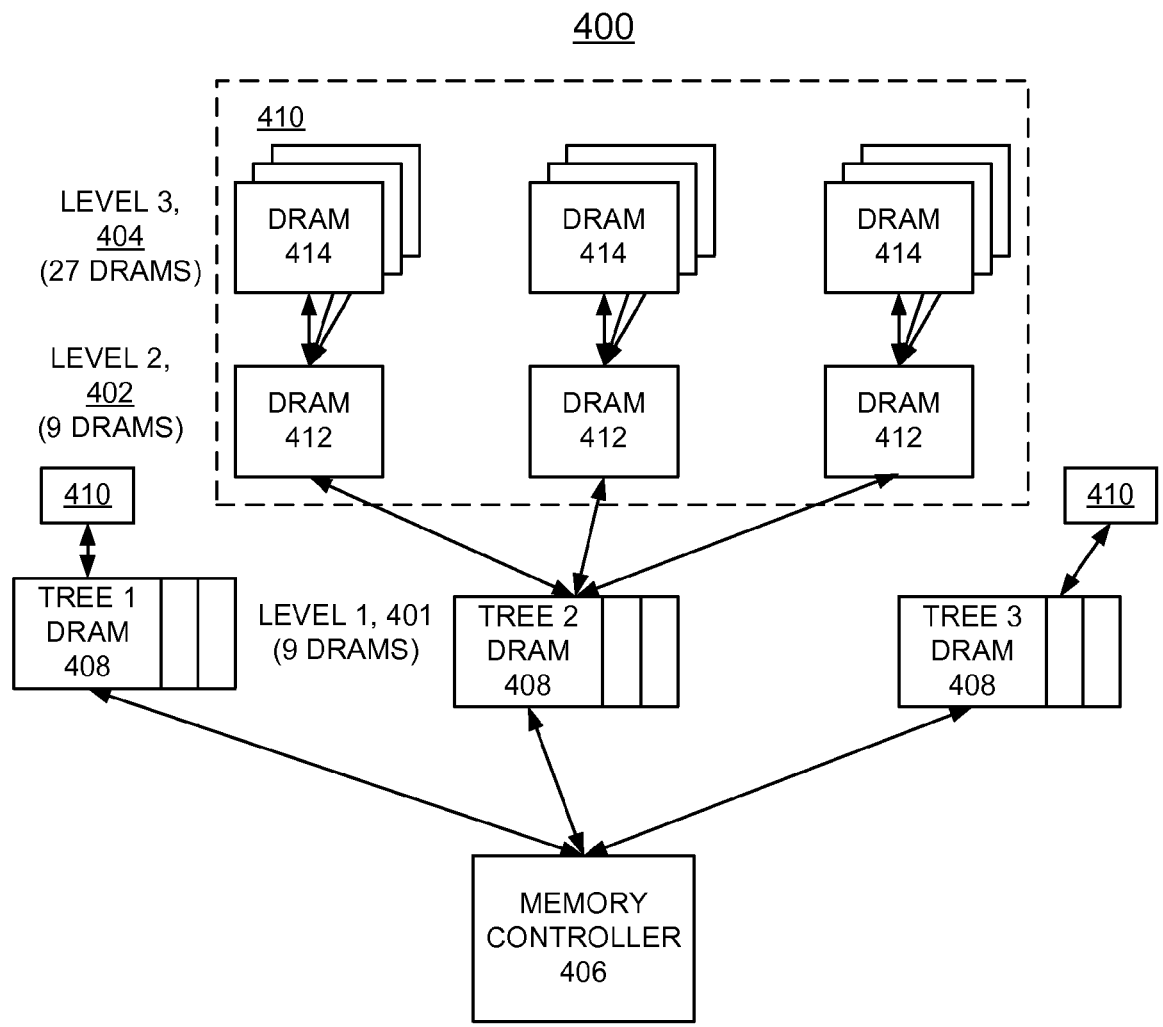
FIG. 4 is a block diagram representation illustrating another example memory subsystem of the system of FIG. 1 for implementing enhanced memory performance management with configurable bandwidth versus power usage in accordance with a preferred embodiment.
Figure 5A:
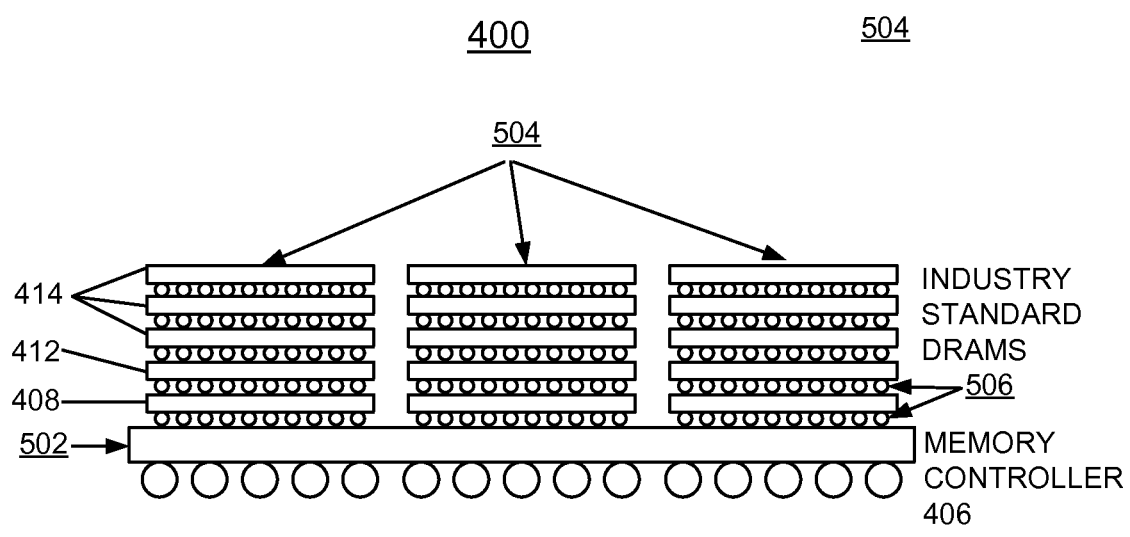
FIGS. 5A and 5B illustrate the example memory subsystem of FIG. 4 for implementing enhanced memory performance management with configurable bandwidth versus power usage in accordance with a preferred embodiment.
Figure 5B:
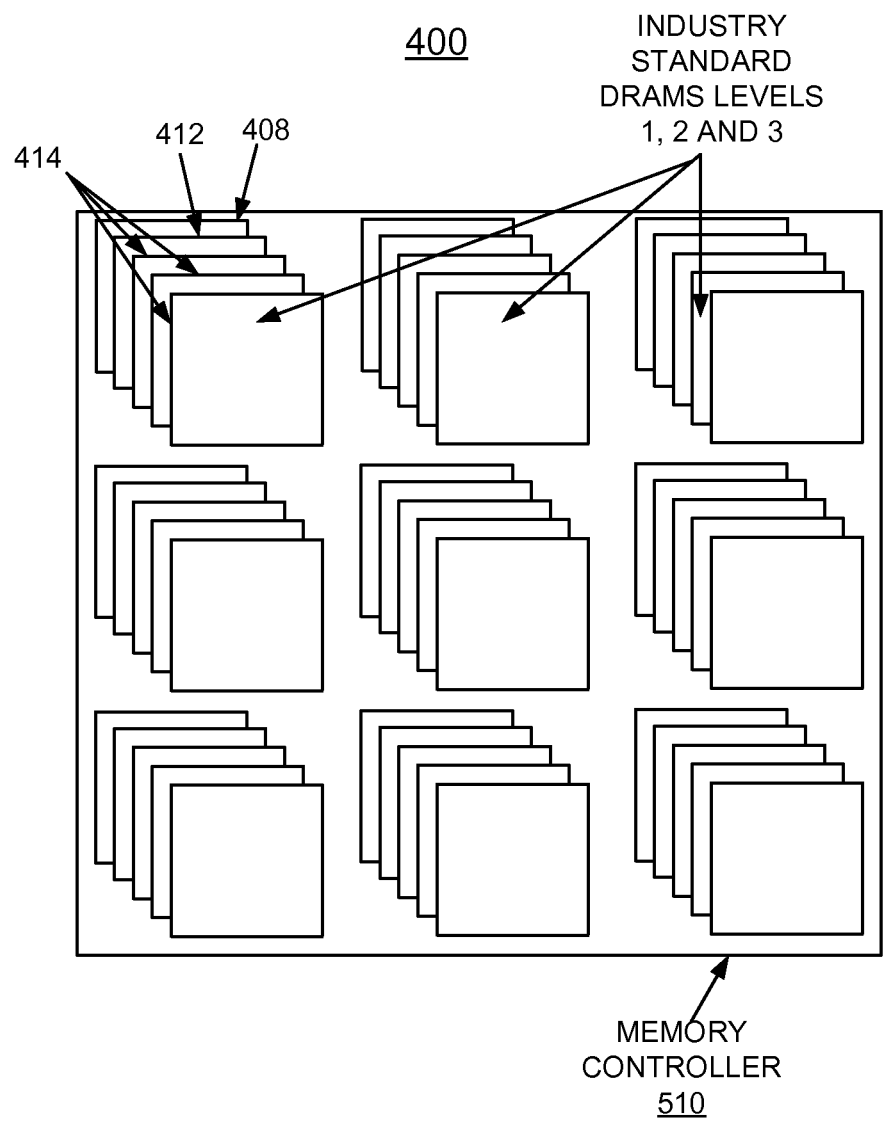
Figure 6A:
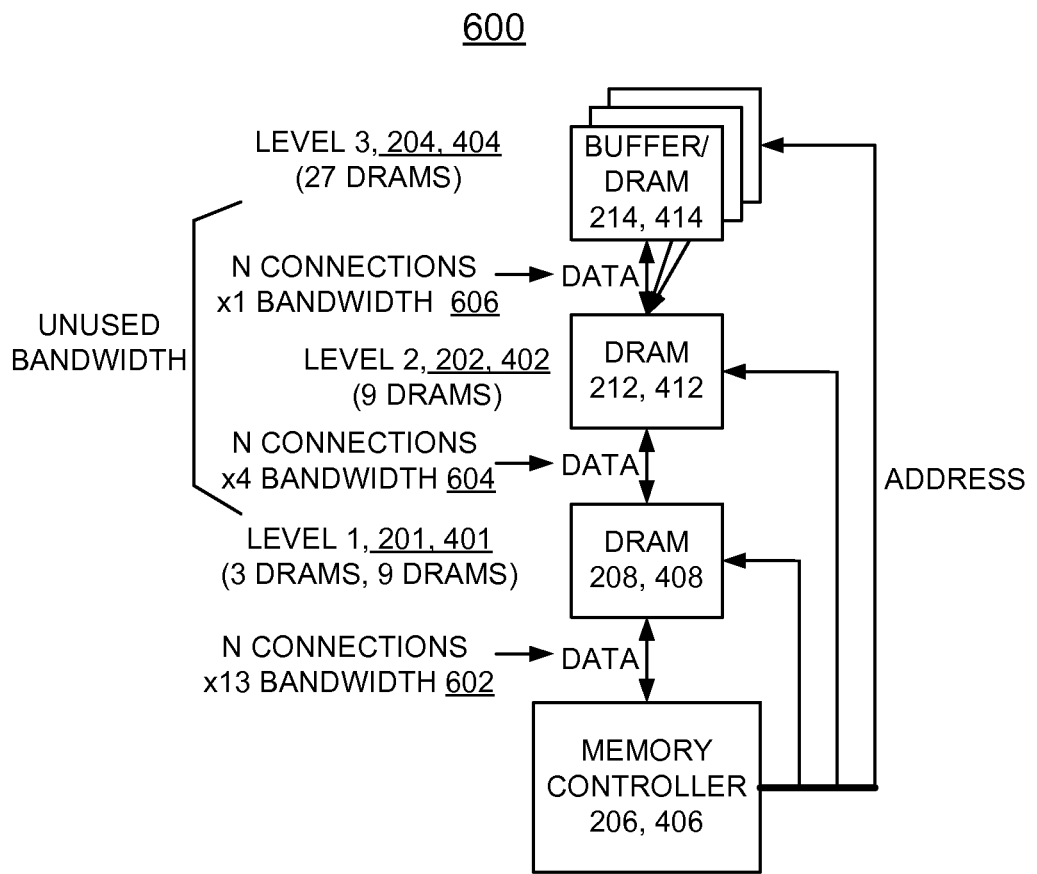
FIGS. 6A and 6B illustrate the example memory subsystems of FIGS. 2, 3A, and 3B and FIGS. 4, 5A, and 5B for implementing enhanced memory performance management with configurable bandwidth versus power usage in accordance with the preferred embodiment.
Figure 6B:
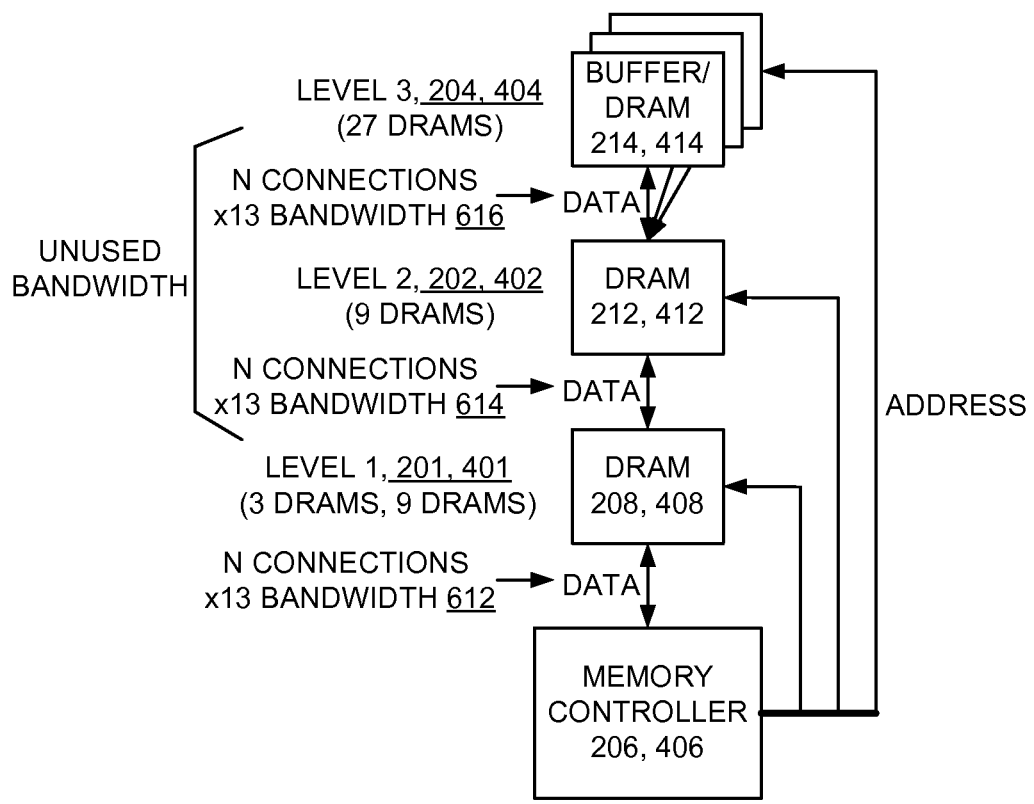

Example embodiments for implementing memory system 106 in accordance with preferred embodiments including the example configurations of controller 108 including the error log and counters 109, main memory 110 and bus 112 are illustrated in FIGS. 2, 3A, and 3B, FIGS. 4, 5A, and 5B; and FIGS. 6A, and 6B.

Figure 2:
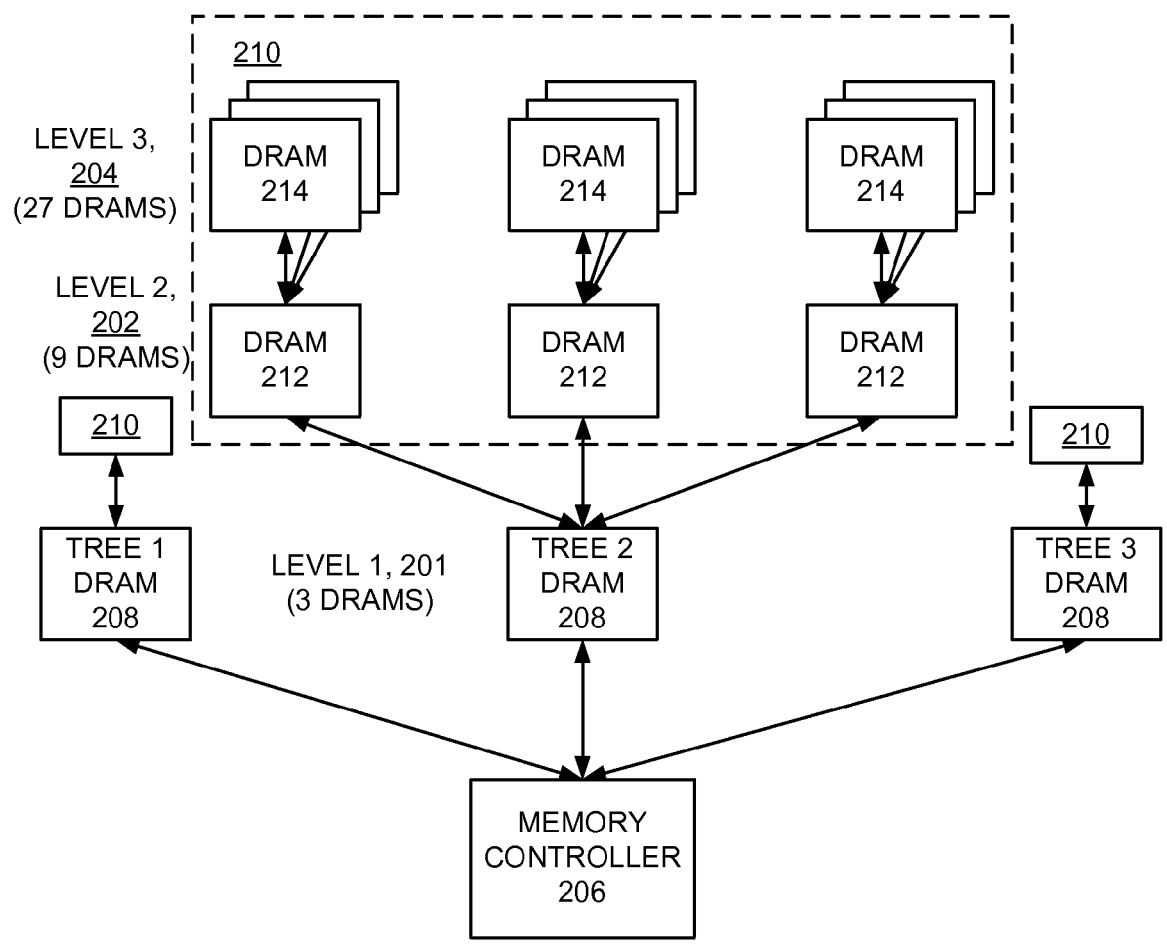
FIG. 2 is a block diagram representation illustrating an example memory subsystem of the system of FIG. 1 for implementing enhanced memory performance management with configurable bandwidth versus power usage in accordance with a preferred embodiment.

Referring to FIG. 2, there is shown an example memory subsystem generally designated by the reference character 200 for implementing enhanced memory performance management with configurable bandwidth versus power usage in accordance with a preferred embodiment. Memory subsystem 200 includes three DRAM levels including a level 1, 201, a level 2, 202, and a level 3, 204 and a memory controller 206. As shown, the level 1, 201 includes 3 DRAMs including a TREE 1, DRAM 208, a TREE 2, DRAM 208, and a TREE 3, DRAM 208. Each DRAM of the respective level 1, 201 including TREE 1, DRAM 208, TREE 2, DRAM 208, and TREE 3, DRAM 208 is coupled to a block 210, each block 210 including level 2, 202 and level 3, 204 DRAMs. The blocks 210 together include level 2, 202 including a total of 9 DRAMs 212, and level 3, 204 including a total of 27 DRAMs 214.

Figure 3A:
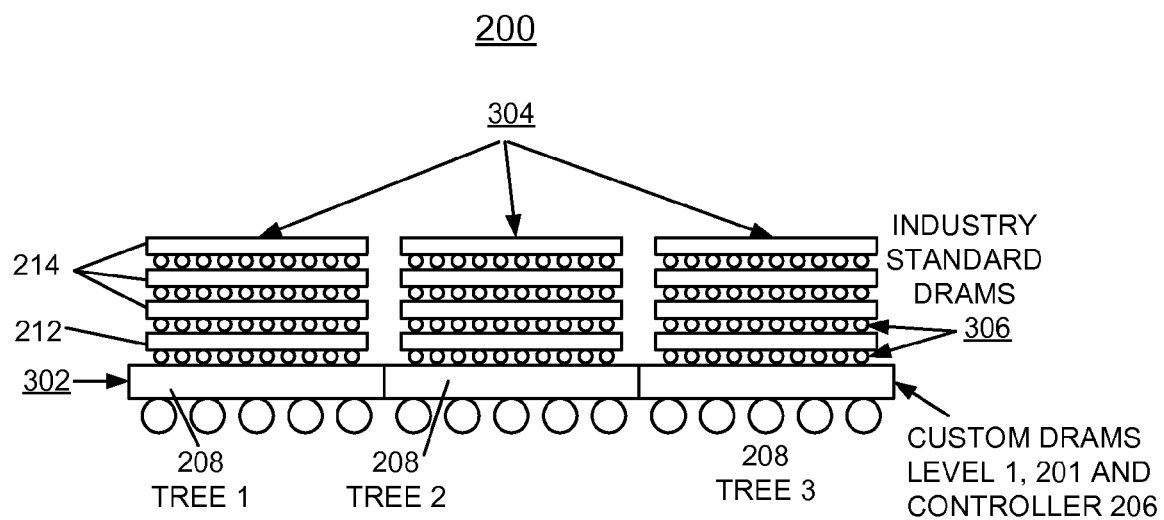
FIGS. 3A and 3B illustrate the example memory subsystem of FIG. 2 for implementing enhanced memory performance management with configurable bandwidth versus power usage in accordance with a preferred embodiment.
Figure 3B:
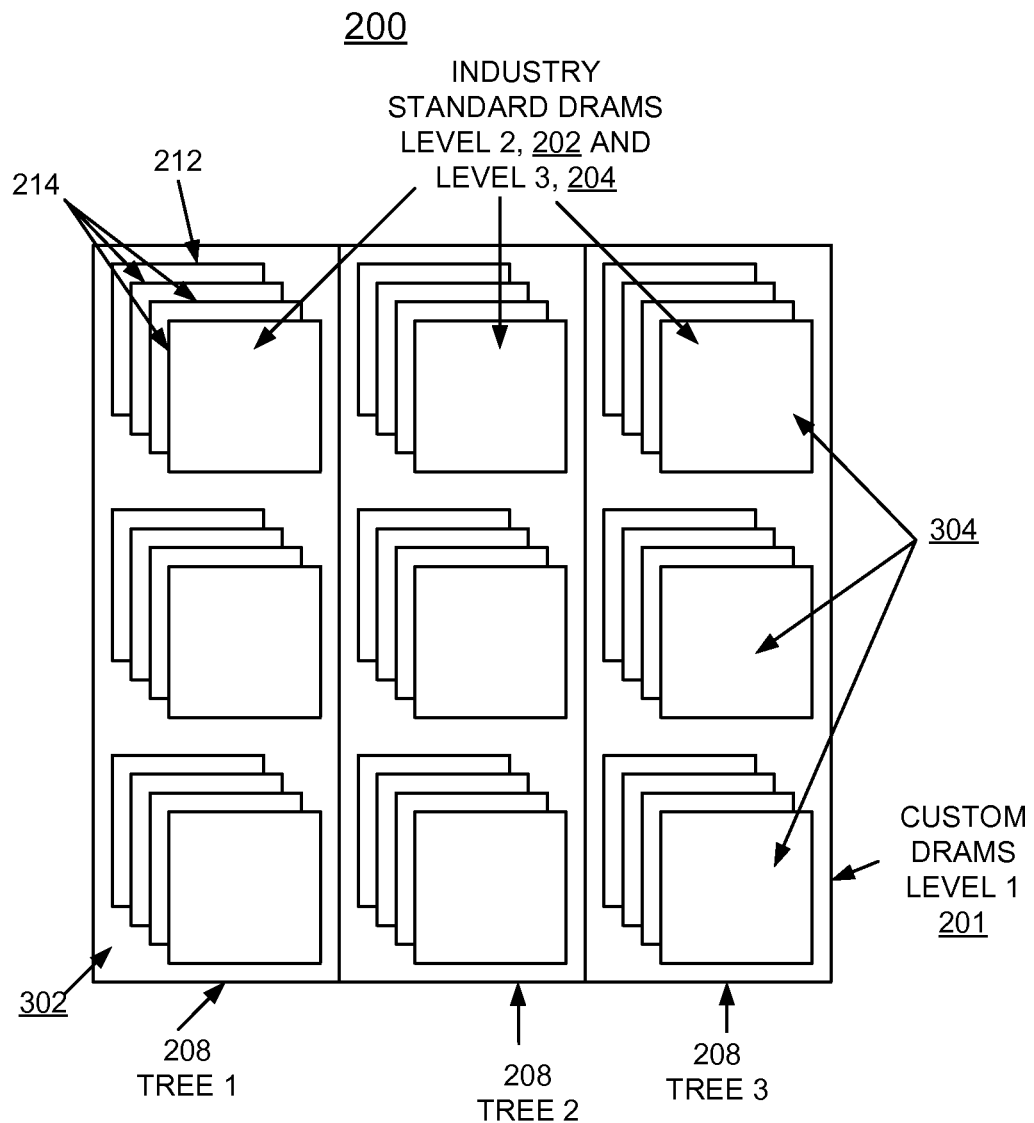

Referring also to FIGS. 3A and 3B, there is shown an example physical implementation of the memory subsystem 200 for implementing enhanced memory performance management with configurable bandwidth versus power usage in accordance with a preferred embodiment. Memory subsystem 200 includes a silicon carrier 302 including custom DRAM chips 208 and optionally including the memory controller 206, and a plurality of chip stacks 304 logically configured in the three ranks level 1, 201, level 2, 202, and level 3 with increasing numbers of DRAMs. Each memory chip stack 304 includes the custom DRAM 208, and preferably includes industry standard DRAMs including the level 2, 202, DRAM 212, and three level 3, 204, DRAMs 214.

The memory chip stacks 304 preferably are connected with through silicon via (TSV) interconnections 306 extending through the DRAMs 208, 212, 214 from layer to layer in the respective stack. The use of TSVs 306 allows significantly more IO capacity off the chip than, for example, standard JEDEC memory packages and more TSVs, in fact, than could even be connected to circuits, given the size of most memory die. Each chip stack 304 of memory chips 208, 212, 214 is connected in a predefined density to allow a substantially full-bandwidth connection between each chip in the stack, advantageously with the through silicon via (TSV) interconnections 306.

Referring to FIG. 4 there is shown another example memory subsystem generally designated by the reference character 400 for implementing enhanced memory performance management with configurable bandwidth versus power usage in accordance with a preferred embodiment. Memory subsystem 400 includes three DRAM levels including a level 1, 401, a level 2, 402, and a level 3, 404 and a memory controller 406. The level 1, 401 includes 9 DRAMs including a plurality or 3 TREE 1, DRAMs 408, a plurality or 3 TREE 2, DRAMs 408, and a plurality or 3 TREE 3, DRAMs 408. Each of the respective level 1, 201 DRAMs, TREE 1, DRAM 208, TREE 2, DRAM 208, and TREE 3, DRAM 208 is coupled to a block 410, each including level 2, 402 and level 3, 404 DRAMs. The blocks 410 together include the level 2, 402 including a total of 9 DRAMs 412, and level 3, 404 including a total of 27 DRAMs 214.

In accordance with features of the invention, in memory subsystem 400, the level 1, 401 includes the 9 DRAMs 408, providing each level 2, 402 and level 3, 404 DRAMs 212, 214 with a dedicated level 1 DRAM 408. Memory subsystem 400 allows a standard 5-high DRAM stack to be constructed entirely out of standard parts, and to be mounted onto a carrier which includes the memory controller 406.

Referring also to FIGS. 5A and 5B there is shown an example physical implementation of the memory subsystem 400 for implementing enhanced memory performance management with configurable bandwidth versus power usage in accordance with a preferred embodiment. Memory subsystem 400 includes a silicon carrier 502 including the memory controller 406, and a plurality of chip stacks 504 logically configured in the three ranks of level 1, 401, level 2, 402, and level 3, 404 with increasing numbers of DRAMs. Each memory chip stack 504 preferably includes all industry standard DRAMs including the level 1, 401, DRAM 408, level 2, 402, DRAM 412, and three level 3, 404, DRAMs 414.

The memory chip stacks 504 preferably are connected with through silicon via (TSV) interconnections 506 extending through the DRAMs 408, 412, 414 from layer to layer in the respective stack. The use of TSVs 506 allows significantly more IO capacity off the chip than, for example, standard JEDEC memory packages and more TSVs, in fact, than could even be connected to circuits, given the size of most memory die. Each chip stack 504 of memory chips 408, 412, 414 is connected in a predefined density to allow a substantially full-bandwidth connection between each chip in the stack, advantageously with the through silicon via (TSV) interconnections 506.

In accordance with features of the invention, large-bandwidth data transfers are enabled from the memory chip stack 304, 504 of the respective memory subsystems 200, 400 by trading off increased power usage for memory performance on a temporary basis with the respective memory controller 206, 406 including the data transfer bandwidth control 109 function. Each access optionally gets data from all DRAMs 208, 212, 214; and 408, 412, 414 of the respective memory subsystems 200, 400.

In accordance with features of the invention, in the memory subsystems 200, 400, the data may still be spread over several DRAMs 208, 212, 214 and DRAMs 408, 412, 414, but is also allowed to be limited to only a subset of the DRAMs of the entire hierarchy. This allows the larger data blocks to be addressed and accessed quickly.

In accordance with features of the invention, the data can be configured differently among the DRAMs, and then the unused bandwidth can be hard wired as standard data busses, and typically held in reserve to lower overall power usage. However, when a large block of data is required, such as for a DMA, then the reserve bandwidth is used at the expense of power savings to quickly transfer the data to the controller. In this scenario, all three ranks use the full-speed protocol. The use of through-silicon vias and chip-stacking techniques allow for large numbers of required chip-to-chip interconnections.

FIGS. 6A and 6B illustrate the example memory subsystems of FIGS. 2, 3A, and 3B and 4, 5A, and 5B for implementing enhanced memory performance management with configurable bandwidth versus power usage in accordance with the preferred embodiment.

Referring to FIG. 6A, there is shown an example typical normal bandwidth configuration generally designated by the reference character 600 for the memory subsystems 200 and 400. As shown the normal bandwidth configuration 600 includes a N connections x13 bandwidth 602 for data between the memory controller 206, 406 and the level 1, 201, 401, DRAM 208, 408, a N connections x4 bandwidth 604 for data between the level 1, 201, 401, DRAM 208, 408 and the level 2, 202, 402, DRAMs 212, 412; and a N connections x1 bandwidth 606 for data between the level 2, 202, 402, DRAMs 212, 412 and the level 3, 204, 404, DRAM 214, 414. The N connections x13 bandwidth 602 indicates the relative bandwidth of this interface is thirteen times more than the N connections x1 bandwidth 606. Similarly, the N connections x4 bandwidth 604 indicates the relative bandwidth of this interface is four times more than the N connections x1 bandwidth 606.

Referring to FIG. 6B, there is shown an example typical high bandwidth configuration generally designated by the reference character 610 for the memory subsystems 200 and 400. As shown the high bandwidth configuration 600 includes a N connections x13 bandwidth 612 for data between the memory controller 206, 406 and the level 1, 201, 401, DRAM 208, 408, a N connections x13 bandwidth 614 for data between the level 1, 201, 401, DRAM 208, 408 and the level 2, 202, 402, DRAMs 212, 412; and a N connections x13 bandwidth 616 for data between the level 2, 202, 402, DRAMs 212, 412 and the level 3, 204, 404, DRAM 214, 414.

The bandwidth targets are a function of the type of DRAM used, the number of TSV connections made, and the ability of the memory controller 206, 406 to handle the data. The targets shown x1, x4, and x13 are given in the example typical normal bandwidth configuration 600, and the targets x13, x13, x13 are given in the example high bandwidth configuration 610 for illustrative purposes.

Figure 7:
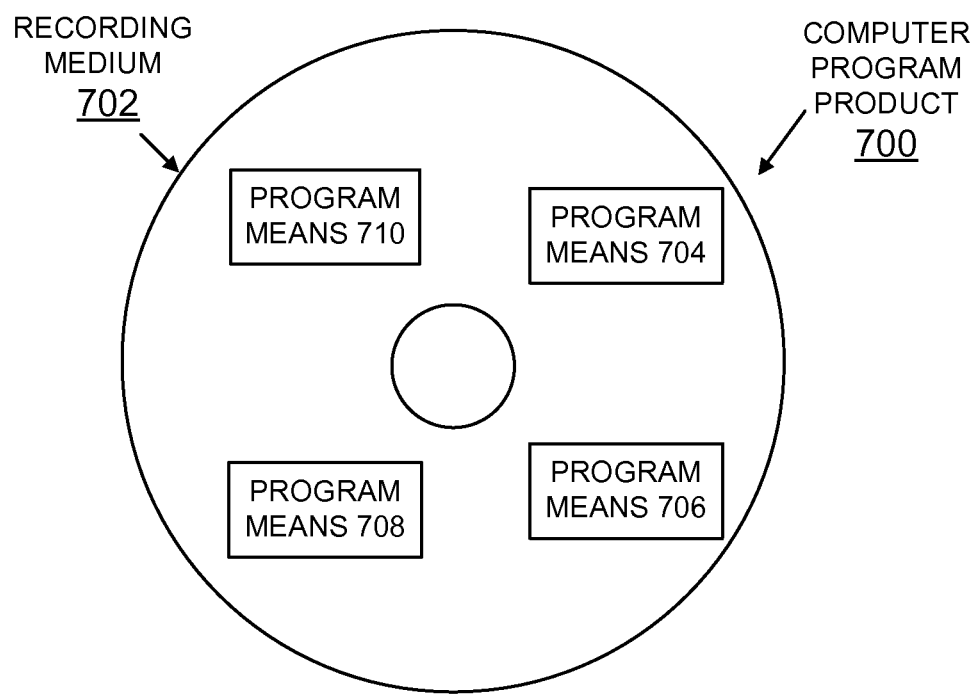
FIG. 7 is a block diagram illustrating a computer program product in accordance with the preferred embodiment.

It should be understood that the present invention is not limited to use with DRAM technology, various other memory devices, such as flash, discrete SRAMs, disk storage, and the like could be used, as well as potential multi-processor applications Referring now to FIG. 7, an article of manufacture or a computer program product 700 of the invention is illustrated. The computer program product 700 is tangibly embodied on a non-transitory computer readable storage medium that includes a recording medium 702, such as, a floppy disk, a high capacity read only memory in the form of an optically read compact disk or CD-ROM, a tape, or another similar computer program product. Recording medium 702 stores program means 704, 706, 708, and 710 on the medium 702 for carrying out the methods for implementing enhanced memory performance management with configurable bandwidth versus power usage of the preferred embodiment in the system 100 of FIG. 1.

A sequence of program instructions or a logical assembly of one or more interrelated modules defined by the recorded program means 704, 706, 708, and 710, direct the computer system 100 for implementing enhanced memory performance management with configurable bandwidth versus power usage of the preferred embodiment.

While the present invention has been described with reference to the details of the embodiments of the invention shown in the drawing, these details are not intended to limit the scope of the invention as claimed in the appended claims.

What is claimed is:

1. A method for implementing enhanced memory performance management comprising:
   providing at least one memory chip stack having a predefined connection density to enable a predefined high bandwidth connection between each chip in said memory chip stack; and
   providing said at least one memory chip stack with a memory controller and a plurality of chip rank levels in said memory chip stack including at least a chip rank level one adjacent said controller; a chip rank level two above said chip rank level one; and a chip level three above said chip rank level two;
   providing a normal bandwidth configuration for said at least one memory chip stack with said chip rank level one with a first bandwidth for data; said chip rank level two with a second bandwidth for data and said chip rank level three with a third bandwidth for data; said first bandwidth greater than both said second bandwidth and said third bandwidth;
   selectively enabling a high bandwidth data transfer from said memory chip stack on a temporary basis; said high bandwidth data transfer including an equal bandwidth for said first bandwidth, said second bandwidth and said third bandwidth.

2. The method as recited in claim 1 wherein providing at least one memory chip stack having a predefined connection density includes connecting said memory chip stack in a predefined density with through silicon via (TSV) interconnections.

3. The method as recited in claim 1 wherein selectively enabling a high bandwidth data transfer from said memory chip stack on a temporary basis includes providing said memory controller coupled to said at least one memory chip stack, said controller using said bandwidth data transfer with said equal bandwidth for said first bandwidth, said second bandwidth and said third bandwidth from said memory chip stack.

4. The method as recited in claim 3 wherein said memory controller selectively enables said high bandwidth data transfer from said memory chip stack on said temporary basis.

5. The method as recited in claim 3 wherein said memory controller selectively requests data at a higher speed than a normal data read speed for the high bandwidth data transfers.

6. The method as recited in claim 1 wherein providing said at least one memory chip stack having a predefined connection density includes providing said at least one memory chip stack of dynamic random access memory (DRAM) chips.

7. The method as recited in claim 1 wherein selectively enabling a high bandwidth data transfer from said memory chip stack on a temporary basis includes receiving a request for a large direct memory access (DMA).

8. The method as recited in claim 1 wherein providing said at least one memory chip stack having a predefined connection density includes providing a silicon carrier including said memory controller and providing said memory chip stack of a plurality of dynamic random access memory (DRAM) chips.

9. The method as recited in claim 8 includes providing said silicon carrier with first level custom DRAM chips and said controller.

10. A system for implementing memory performance management in a computer system comprising:
    a memory including at least one memory chip stack having a predefined connection density to enable a predefined high bandwidth connection between each chip in said memory chip stack;
    a memory controller coupled to said at least one memory chip stack; and said memory chip stack including a plurality of chip rank levels with a chip rank level one adjacent said controller; a chip rank level two above said chip rank level one; and a chip level three above said chip rank level two;
    a data transfer bandwidth control;
    said memory controller, responsive to said data transfer bandwidth control, providing a normal bandwidth configuration for said at least one memory chip stack including said chip rank level one with a first bandwidth for data; said chip rank level two with a second bandwidth for data and said chip rank level three with a third bandwidth for data; said first bandwidth greater than both said second bandwidth and said third bandwidth;
    said memory controller, responsive to said data transfer bandwidth control, selectively enabling a high bandwidth data transfer from said memory chip stack on a temporary basis; said high bandwidth data transfer including an equal bandwidth for said first bandwidth, said second bandwidth and said third bandwidth.

11. The system as recited in claim 10 includes through silicon via (TSV) interconnections between each chip in said memory chip stack.

12. The system as recited in claim 10 includes said controller using said first bandwidth for said high bandwidth data transfer from said memory chip stack.

13. The system as recited in claim 10 wherein said at least one memory chip stack includes a plurality of dynamic random access memory (DRAM) chips.

14. The system as recited in claim 10 includes a silicon carrier supporting said at least one memory chip stack and includes said memory controller.

15. The system as recited in claim 14 wherein said silicon carrier includes first level custom DRAM chips of said at least one memory chip stack.

16. The system as recited in claim 10 wherein said data transfer bandwidth control includes a data transfer bandwidth control computer program product tangibly embodied on a non-transitory computer readable storage medium.

17. The system as recited in claim 10 wherein said at least one memory chip stack includes a plurality of dynamic random access memory (DRAM) chips logically arranged in three levels.

* * * * *